United States Patent [19]

Sekine et al.

[11] Patent Number: 4,758,476
[45] Date of Patent: Jul. 19, 1988

[54] POLYIMIDE PRECURSOR RESIN COMPOSITION AND SEMICONDUCTOR DEVICE USING THE SAME

[75] Inventors: Hiroyoshi Sekine; Hiroshi Suzuki; Hidetaka Sato; Shun-ichiro Uchimura, all of Hitachi; Daisuke Makino, Mito, all of Japan

[73] Assignee: Hitachi Chemical Company, Ltd., Tokyo, Japan

[21] Appl. No.: 806,805

[22] Filed: Dec. 10, 1985

[30] Foreign Application Priority Data

Dec. 12, 1984 [JP] Japan ................... 59-261991
Feb. 13, 1985 [JP] Japan ................... 60-25871

[51] Int. Cl.⁴ ............... B32B 27/06; B32B 15/08; C08G 77/04
[52] U.S. Cl. ................... 428/473.5; 428/429; 428/432; 428/450; 428/458; 428/929; 528/26

[58] Field of Search ............. 430/281, 311; 528/26; 428/473.5, 458, 450, 929, 432, 429; 427/82, 90

[56] References Cited

U.S. PATENT DOCUMENTS 4,416,973 11/1983 Goff ................... 430/281
4,430,418 2/1984 Goff ................... 430/281 X
4,454,220 6/1984 Goff ................... 430/311
4,672,099 6/1987 Kunimune et al. ........ 528/26

Primary Examiner—Thomas J. Herbert
Attorney, Agent, or Firm—Antonelli, Terry & Wands

[57] ABSTRACT

A polyimide precursor resin composition comprising (a) a poly(amic acid) containing siloxane linkages, (b) an aminosilane, and (c) a solvent for both the components (a) and (b), can form a polyimide film excellent in adhesiveness and heat resistance and is suitable for producing a semiconductor device having high reliability.

10 Claims, 3 Drawing Sheets

POLYIMIDE PRECURSOR RESIN COMPOSITION AND SEMICONDUCTOR DEVICE USING THE SAME

BACKGROUND OF THE INVENTION

This invention relates to a polyimide precursor resin composition and semiconductor devices such as hybrid IC, monolithic IC, LSI, etc., using said composition.

Polyimide resins are increasingly used recently for the interlaminar insulating films or surface protective films (which are called passivation films in some cases) in semiconductor devices. This owes to the moisture-resistant protective properties of polyimide resins for wiring materials such as Al (aluminum) and their ease of formation into thin films.

A typical example of the use of polyimide resin for a surface protective film of a semiconductor device is described below with reference to the accompanying drawings.

Referring to FIG. 2 of the accompanying drawings, there is illustrated a semiconductor chip comprising a single-crystal silicon (Si) semiconductor substrate 1 incorporated with semiconductor elements such as diodes, transistors, etc., a 0.4–0.6 μm thick silicon oxide ($SiO_2$) film or phosphorous glass film 2, 3 and 4 covering the main surface of said semiconductor substrate 1 and partly opened by photoetching, and an Al wiring layer constituting a first conductor layer (sublayer) 5, 6 and 7 in resistance contact with the emitter, base and collector regions respectively and overlying said silicon oxide or phosphorous glass film 2, 3 and 4. The Al wiring layer is formed by vacuum evaporation or sputtering and the unnecessary portion is removed by photoetching to form a pattern. This Al wiring layer is, for instance, 1.5 μm thick and 7 μm wide.

Then, usually a solution of an aluminum chelate compound is coated by a spinner or other suitable means on the silicon oxide or phosphorous glass film and Al wiring layer of FIG. 2 and subjected to a heat treatment at about 250° C. for 30 minutes to form an approximately 100–200 Å thick aluminum oxide film 8 as shown in FIG. 3. Then an ordinary polyimide resin precursor polyamide acid solution is further coated by a spinner or other means to form a polyimide resin film 9 to complete a semiconductor device.

Generally, polyimide resin film has poor adhesion to silicon oxide film, Al wiring layer, etc., so that an aluminum chelate treatment is applied to improve the adhesive force. This adhesive force has a close relation to the moisture resistance reliability of the semiconductor device, and in fact moisture resistance of the semiconductor device is greatly improved by increasing the adhesive force.

Generally, the following methods are known for improving adhesiveness of polyimide resin: (1) the substrate surface is treated with a solution containing a primer such as aluminum chelate, silane coupling agent, etc., before coating with a poly(amic acid) such as mentioned below; (2) a silane coupling agent is added to the poly(amic acid) solution immediately before use; (3) a diaminosiloxane is copolymerized to introduce siloxane linkages to the poly(amic acid).

The method (1), however, has a problem that the wafer process is complicated. In the case of the method (2), in order to afford a sufficient adhesiveness to the polyimide resin film, a silane coupling agent must be added in an amount of 5% or more by weight based on the poly(amic acid) solution, but the addition of such a large amount of silane coupling agent greatly reduces the viscosity stability of the poly(amic acid) solution and invites excess bodying-up of the solution, which may even result in gelation of the solution, so that it is impossible to keep in storage the poly(amic acid) solution in a state added with a silane coupling agent. In the method (2), therefore, in case the produced semiconductor device is applied to electronic instruments or apparatuses in which even slight contamination with alien matter could be a cause of serious trouble, the silane coupling agent must be added just before use and succeeding filtration for eliminating alien matter is indispensable. This greatly handicaps the process. According to the method (3), although the adhesive force is sufficiently improved at room temperature, this adhesive force drops sharply and the moisture resistance reliability of the semiconductor device is also lowered when the product is subjected to a pressure cook test at 121° C. under 2.1 atm.

Semiconductor devices are usually sealed with a thermosetting resin in practical use. The primary reason for use of resin seal is low material cost. Another reason is the ease of rationalization of production leading to a cost reduction. However, examination by the present inventors of moisture resistance of said resin sealed semiconductor devices disclosed that Al wiring of the conductor layer suffers from corrosion when the semiconductor device is left under a harsh condition for a long time as the resin itself has the nature to allow passage of moisture from the outside. It was thus found that said resin sealed semiconductor devices have a problem in reliability in their use in the fields where a high degree of reliability is required, especially in the industrial uses.

In order to enhance reliability of semiconductor devices, some ideas have been introduced such as use of Al containing a few percent of Si (silicon) for the conductor layer. Use of such Si-containing Al, however, involves a problem of elevated material cost.

Said defect of resin seal, when considered here with reference to a semiconductor device having a double-layer wiring structure, may be attributed to the following reason: in the resin sealed semiconductor device, the moisture which has penetrated into the device from the outside through the resin sealant is reacted with Al wiring of the conductor layer for some reason or other, resulting in inviting corrosion.

Polyimide resin film is almost free of crack and therefore has no possibility of moisture penetration through cracks, but on the other hand, such polyimide resin film, being an organic matter, has an innate tendency to absorb water into the inside and this is considered responsible for possible corrosion of Al wiring. As a result of investigations of semiconductor devices using Al for conductor layer and polyimide resin for insulating layer, the present inventors found that in the case of double-layer wiring, Al of the conductor layer forming the upper-layer wiring in contact with resin layer is far more liable to corrosion than Al of the conductor layer which is not in contact with resin layer.

This fact dictates that the corrosion of Al conductor layer is not only related to hygroscopicity of polyimide resin layer but is also associated with the adhesive strength at the interface between the conductor layers and the sandwiched polyimide resin films or between the individual polyimide resin films, and it is thus considered that if said adhesive strength is low, the absorbed moisture exists at the interfaces to cause corrosion of Al conductor layers. Especially in the case of said double-layer wiring, since the adhesive strength at the interface between the polyimide resin forming the intervening insulating layer and the conductor layer or between the polyimide resin films is low, the conductor layer in contact with the polyimide resin layer is more likely to be corroded than the conductor layer not in contact with said polyimide resin film.

SUMMARY OF THE INVENTION

An object of this invention is to provide a polyimide precursor resin composition having excellent viscosity stability and capable of forming a polyimide film excellent in adhesiveness and heat resistance.

Another object of this invention is to provide a semiconductor device with high reliability using a polyimide resin film with excellent adhesiveness on conductor layer.

The present invention provides a polyimide precursor resin composition comprising (a) a poly(amic acid) having siloxane linkages obtained by reacting an aromatic diamine, a diaminosiloxane and an aromatic tetracarboxylic acid dianhydride, (b) an aminosilane represented by the formula:

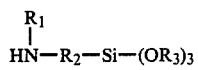

wherein $R_1$ is a hydrogen atom or a monovalent hydrocarbon residue; $R_2$ is a divalent hydrocarbon residue; and $R_3$ is a monovalent hydrocarbon residue, and (c) a solvent capable of dissolving said compounds (a) and (b), the proportion of said diaminosiloxane used for the reaction being 0.1–10% by mole based on the total molar quantity of said aromatic diamine and said diaminosiloxane, and the proportion of said aminosilane in the composition being 0.1–2.0% by weight based on said poly(amic acid).

The present invention further provides a semiconductor device having formed on conductor layers a polyimide resin film made by the dehydration and ring closure of a polyimide precursor resin composition comprising (a) a poly(amic acid) containing siloxane linkages obtained by reacting an aromatic diamine, a diaminosiloxane and an aromatic tetracarboxylic acid dianhydride, and (b) an aminosilane represented by the formula:

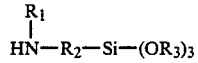

wherein $R_1$ is a hydrogen atom or a monovalent hydrocarbon residue; $R_2$ is a divalent hydrocarbon residue; and $R_3$ is a monovalent hydrocarbon residue, the proportion of said diaminosilane used for the reaction being 0.1–10% by mole based on the total molar quantity of said aromatic diamine and said diaminosiloxane, and the proportion of said aminosilane in the composition being 0.1–2.0% by weight based on said poly(amic acid).

DESCRIPTION OF THE PREFERRED EMBODIMENTS

Figure 1:
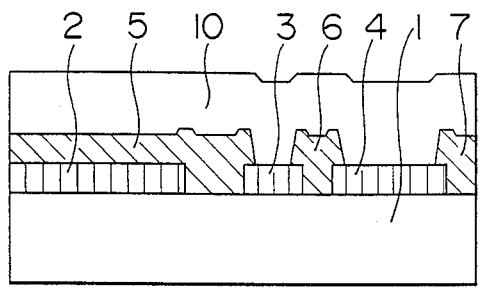
FIG. 1 is a sectional view of a semiconductor chip in an embodiment of this invention.

Aromatic diamines usable for the preparation of poly(amic acid) (a) containing siloxane linkages include 4,4'-diaminodiphenylether, 4,4'-diaminodiphenylmethane, 4,4'-diaminodiphenylsulfone, 4,4'-diaminodiphenyl sulfide, benzidine, metaphenylenediamine, paraphenylenediamine, 1,5-naphthalenediamine, 2,6-naphthalenediamine and the like. These compounds may be used either alone or as a mixture thereof.

Said aromatic diamines also include diaminoamide compounds represented by the formula:

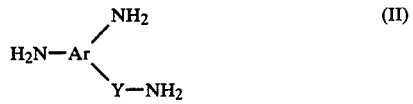

wherein Ar is an aromatic group; and Y is $SO_2$ or CO, and one amino group and the Y—$NH_2$ are at the ortho positions relative to each other. Examples of such diaminoamide compounds are 4,4'-diaminodiphenylether-3-sulfoneamide, 3,4'-diaminodiphenylether-4-sulfoneamide, 3,4'-diaminodiphenylether-3'-sulfoneamide, 3,3'-diaminodiphenylether-4-sulfoneamide, 4,4'-diaminodiphenylmethane-3-sulfoneamide, 3,4'-diaminodiphenylmethane-4-sulfoneamide, 3,4'-diaminodiphenylmethane-3'-sulfoneamide, 3,3'-diaminodiphenylmethane-4-sulfoneamide, 4,4'-diaminodiphenylsulfone-3-sulfoneamide, 3,4'-diaminodiphenylsulfone-4-sulfoneamide, 3,4'-diaminodiphenylsulfone-3'-sulfoneamide, 3,3'-diaminodiphenylsulfone-4-sulfoneamide, 4,4'-diaminodiphenylsulfide-3-sulfoneamide, 3,4'-diaminodiphenylsulfide-4-sulfoneamide, 3,3'-diaminodiphenylsulfide-4-sulfoneamide, 3,4'-diaminodiphenylsulfide-3'-sulfoneamide, 1,4-diaminobenzene-2-sulfoneamide, 4,4'-diaminodiphenylether-3-carbonamide, 3,4'-diaminodiphenylether-4-carbonamide, 3,4'-diaminodiphenylether-3'-carbonamide, 3,3'-diaminodiphenylether-4-carbonamide, 4,4'-diaminodiphenylmethane-3-carbonamide, 3,4'-diaminodiphenylmethane-4-carbonamide, 3,4'-diaminodiphenylmethane-3'-carbonamide, 3,3'-diaminodiphenylmethane-4-carbonamide, 4,4'-diaminodiphenylsulfone-3 carbonamide, 3,4'-diaminodiphenylsulfone-4-carbonamide, 3,4'-diaminodiphenylsulfone-3'-carbonamide, 3,3'-diaminodiphenyl-sulfone-4carbonamide, 4,4'-diaminodiphenylsulfide - 3-carbonamide, 3,4'-diaminodiphenylsulfide-4-carbonamide, 3,3'-diaminodiphenylsulfide-4-carbonamide, 3,4'-diaminodiphenylsulfide-3'-sulfoneamide, and 1,4-diaminobenzene-2-carbonamide.

Diaminosiloxanes usable in this invention for introducing siloxane linkages into poly(amic acid) are represented by, for instance, the following formula:

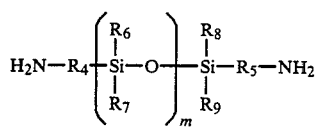

wherein $R_4$ and $R_5$ are independently a divalent hydrocarbon residue such as an alkylene group, a phenylene group, an alkyl-substituted phenylene group, etc.; $R_6$, $R_7$, $R_8$ and $R_9$ are independently a monovalent hydrocarbon residue such as an alkyl group, a phenyl group; and m is an integer of 1 or greater. Examples of these diaminosiloxanes are the compounds represented by the following formulae:

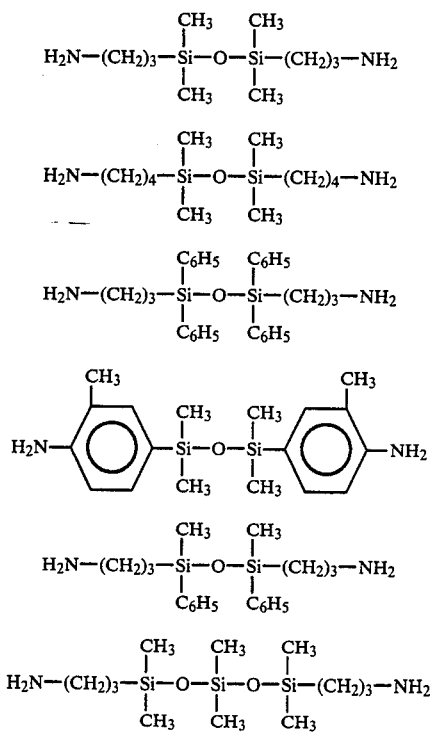

These compounds may be used alone or as a mixture thereof.

Aromatic tetracarboxylic acid dianhydrides usable for said reaction in this invention include, for example, pyromellitic acid dianhydride, 3,3',4,4'-diphenyltetracarboxylic acid dianhydride, 3,3',4,4'-benzophenonetetracarboxylic acid dianhydride, cyclopentanetetracarboxylic acid dianhydride, 1,2,5,6-naphthalenetetracarboxylic acid dianhydride, 2,3,6,7-naphthalenetetracarboxylic acid dianhydride, 2,3,5,6-pyridinetetracareboxylic acid dianhydride, 1,4,5,8-naphthalenetetracarboxylic acid dianhydride, 3,4,9,10-perillenetetracarboxylic acid dianhydride, and 4,4'-sulfonyldiphthalic acid dianhydride. These compounds may be used alone or as a mixture thereof.

For producing a poly(amic acid) having siloxane linkages, said aromatic diamine, diaminosiloxane and aromatic tetracarboxylic acid dianhydride are reacted in a solvent by regulating their amounts such that the combined amount of said aromatic diamine and diaminosiloxane is substiantially equimolar with said aromatic tetracarboxylic acid dianhydride.

As the solvent, there can be used, for example, N-methyl-2-pyrrolidone, N,N-dimethylacetamide, N,N-dimethylformamide, N,N-diethylformamide, dimethyl sulfoxide, hexamethylphosphoramide, tetramethylenesulfone and the like. These compounds can be used individually or in combination.

Aminosilanes usable in this invention are represented by the formula:

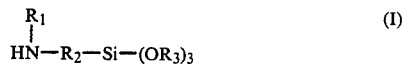

wherein $R_1$ is a hydrogen atom, or a monovalent hydrocarbon residue such as an alkyl group, a phenyl group, an alkyl-substituted phenyl group,

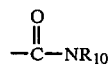

(in which $R_{10}$ is a hydrogen atom, an alkyl group, a phenyl group, or an alkyl-substituted phenyl group), or derivatives thereof such as those substituted with one or more halogen atoms, etc., the alkyl group having preferably 1 to 5 carbon atoms; $R_2$ is a divalent hydrocarbon residue such as an alkylene group preferably having 1 to 5 carbon atoms, a phenylene group, an alkyl-substituted phenylene group, or derivatives thereof such as those obtained by substituting with one or more halogen atoms, etc.; and $R_3$ is a monovalent hydrocarbon residue such as an alkyl group having preferably 1 to 5 carbon atoms.

Examples of these aminosilanes are γ-aminopropyltrimethoxysilane, γ-aminopropyltriethoxysilane, γ-aminobutyltriethoxysilane, N-phenyl-γ-aminopropyltriethoxysilane, N-β-(aminoethyl)-γ-aminopropyltrimethoxysilane, γ-ureidopropyltriethoxysilane and the like. These compounds may be used alone or as a mixture thereof.

A solvent (c) is added in use of the polyimide precursor resin according to this invention. Such a solvent should be the one which can dissolve both of said poly(amic acid) containing siloxane linkages and said aminosilanes. For instance, the solvent used for the preparation of said poly(amic acid) containing siloxane linkages can be employed. A single solvent or a mixture of two or more of proper solvents can be used. Such a solvent (or solvent mixture) is used preferably in such an amount range where the concentration of poly(amic acid) containing siloxane linkages will become 5–25% by weight.

In the resin composition according to this invention, the ratio of siloxane linkages in poly(amic acid) containing siloxane linkages is defined to a specific range. That is, the ratio of diaminosiloxane mixed should be 0.1–10% by mole, preferably 0.5–5% by mole, based on the total molar quantity of aromatic diamine and diaminosiloxane. If the amount of diaminosiloxane is less than 0.1% by mole, no satisfactory adhesiveness-improving effect is provided, and if its amount exceeds 10% by mole, inherent heat resistance of polyimide is reduced.

The ratio of aminosilane mixed is 0.1–2.0% by weight, preferably 0.3–1.0% by weight, based on poly(amic acid) containing siloxane linkages. If the amount of aminosilane is less than 0.1% by weight, the produced adhesiveness-improving effect is unsatisfactory, and if its amount exceeds 2.0% by weight, the stability of the produced resin composition is impaired.

For producing the resin composition according to this invention, poly(amic acid) containing siloxane linkages is first prepared. Such poly(amic acid) can be obtained by a known method, for example, by a method comprising dissolving an aromatic diamine and a diaminosiloxane in said solvent, adding thereto an aromatic tetracarboxylic acid dianhydride, and reacting them under stirring at a temperature below 80° C., preferably close to or below room temperature.

This poly(amic acid) is adjusted to a viscosity suitable for use and then added, at or below room temperature, with an aminosilane which has been diluted with said solvent to a concentration of 10% by weight or below, followed by mixing under stirring to obtain the objective resin composition.

The resin composition of this invention can be made into a polyimide film excellent in adhesiveness and heat resistance by treating said composition in the usual way, for instance, by applying said composition on a glass plate, drying it at 100°–200° C. for 0.5–3 hours and then curing the same at 250°–400° C. for 0.5–3 hours.

The polyimide film obtained from the resin composition of this invention is very excellent in adhesiveness and heat resistance. The resin composition also has very excellent viscosity stability. Therefore, the resin composition of this invention can be widely applied to uses for electronic parts, etc., which are required to have a high degree of reliability.

For application to semiconductor devices, the resin composition of this invention is coated on a conductor layer by a spinner or other suitable means, dried preferably at 100°–250° C. for 10 minutes to 3 hours and then further heated preferably at 250°–400° C. for 30 minutes to 3 hours to effect dehydration and ring closure of said composition to form polyimide resin.

The polyimide resin film in accordance with this invention can be used, for example, as an inorganic insulating film provided on the surface of a semiconductor substrate having at least one semiconductor element or a resin film overlying a conductor layer for wiring, or as an organic resin insulating film provided on the topmost wiring conductor layer in a multilayer wiring structure having a first conductor layer for wiring through a silicon oxide or silicon nitride insulating film provided on the surface of a semiconductor substrate having at least one semiconductor element and further having thereon the second, third or more wiring conductor layers with an organic resin insulating film intervening therebetween.

In the present invention, said polyimide resin film is formed on a conductor layer. In the case of a semiconductor device having plural conductor layers, said polyimide resin film may be provided on the topmost conductor layer or on the conductor layer formed immediately therebelow. Also, said resin film may be formed on both of the topmost conductor layer and the succeeding conductor layer or on one of them. Formation of said polyimide resin film on a conductor layer can be accomplished by known means, whether it is formed on the topmost conductor layer or on the succeeding layer.

Figure 2:
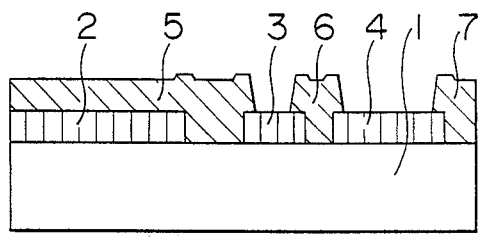
FIG. 2 is a sectional view of the semiconductor chip before covered with a polyimide resin film.
Figure 3:
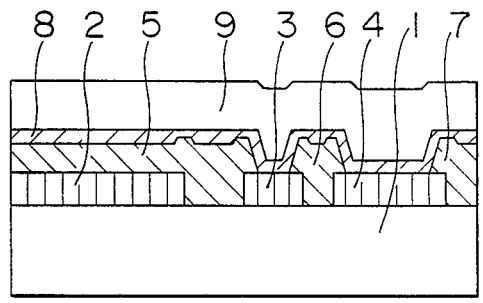
FIG. 3 is a sectional view of a semiconductor chip using a conventional primer.

In the accompanying drawings, FIG. 1 is a sectional view of a semiconductor chip in an embodiment of this invention, and FIG. 3 is a sectional view of a semiconductor chip using a conventional primer. Reference numerals used in these drawings correspond to those in FIG. 2. Numeral 8 indicates an aluminum oxide film, and 9 and 10 a polyimide resin film.

The present invention is further described below by way of Examples thereof and Comparative Examples.

EXAMPLE 1

6.035 g of 4,4'-diaminodiphenylether, 0.394 g of 1,3-bis(aminopropyl)tetramethyldisiloxane, 3.460 g of pyromellitic acid dianhydride and 5.110 g of 3,3',4,4'-benzophenonetetracarboxylic acid dianhydride were reacted in 85.0 g of N-methyl-2-pyrrolidone at room temperature to obtain 100 g of a solution of poly(amic acid) containing siloxane linkages. This solution had a viscosity of 200 ps, so it was stirred at 80° C. to lower its viscosity of 10 ps.

A solution was separately prepared by dissolving 1 g of γ-aminopropyltriethoxysilane in 9 g of N-methyl-2-pyrrolidone, and 0.75 g of this solution was added to 100 g of said poly(amic acid) solution which had been adjusted to said viscosity and cooled to room temperature, and the mixed solution was stirred at room temperature for one hour. The thus obtained resin composition of this invention had a nonvolatile content of 14.3% as measured at 200° C. for a duration of 2 hours and a viscosity of 10.5 ps at 25° C.

Said resin composition was coated on a glass plate by a rotary coater and cured in the air under the conditions of 150° C./1 hour, and 350° C./1 hour to obtain a polyimide film containing siloxane linkages. The adhesiveness of this film to a glass substrate was evaluated by a cross-cut test. The film didn't peel off not only in the early period of the test but also even after 100-hour continuous execution of pressure cook test at 121° C. under 2.2 atm.

Also, heat resistance of the similarly produced film was determined by using a differential heat balance. The film showed a thermal decomposition starting temperature of 440° C., indicating high heat resistance.

Examination of viscosity stability of said resin composition under the condition of 5° C. storage showed that the composition maintained a viscosity of 11.0 ps after the lapse of three months, indicating no problem in practical use.

Figure 7:
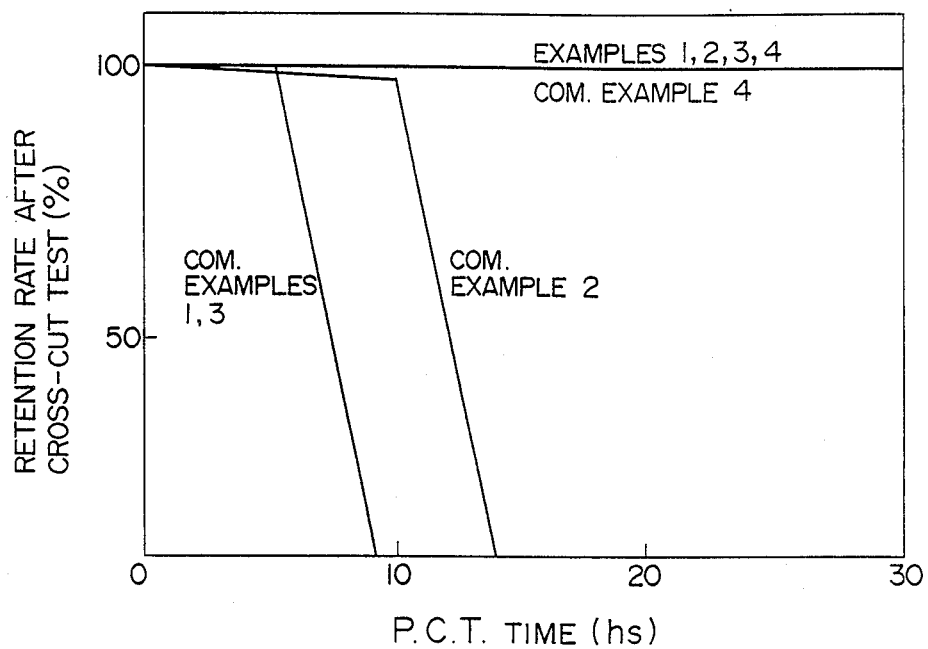
FIG. 7 is a graph showing the results of an adhesion test conducted in an Example of this invention and in a Comparative Example.
Figure 8:
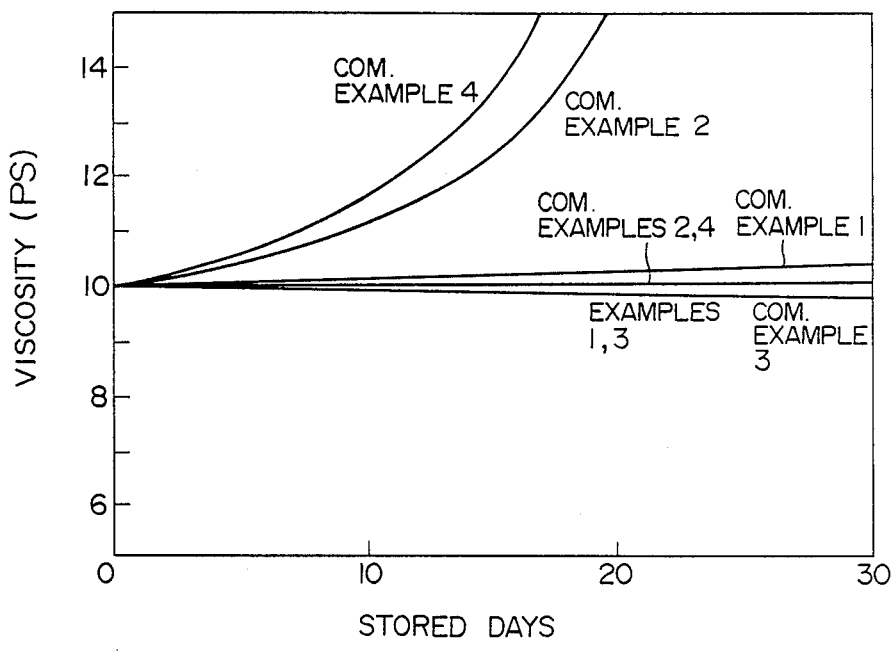
FIG. 8 is a graph showing viscosity stability in the Examples of this invention and in the Comparative Examples.

These results are shown in Table 1 and FIGS. 7 and 8.

EXAMPLE 2

5.571 g of 4,4'-diaminodiphenylether, 0.750 g of 4,4'-diaminodiphenylether-3-carbonamide, 0.157 g of 1,3-bis(aminopropyl)tetramethyldisiloxane, 3.441 g of pyromellic acid dianhydride and 5.081 g of 3,3',4,4'-benzophenonetetracarboxylic acid dianhydride were reacted in 85 g of N-methyl-2-pyrrolidone at room temperature to obtain 100 g of a solution of poly(amic acid) containing siloxane linkages.

To this solution was added 1.5 g of the aminosilane solution used in Example 1 to prepare a resin composition. This resin composition was subjected to the same test and evaluation as conducted in Example 1 to find the composition had excellent adhesiveness, viscosity stability and heat resistance. The results are shown in Table 1 and FIGS. 7 and 8.

EXAMPLE 3

A solution was prepared by dissolving 1 g of N-phenyl-γ-aminopropyltriethoxysilane in 9 g of N-methyl-2-pyrrolidone, and 0.75 g of this solution was added to 100 g of the poly(amic acid) solution used in Example 1. The resulting composition was tested and evaluated as in the preceeding Examples. The results are shown in Table 1 and FIGS. 7 and 8.

EXAMPLE 4

A solution was prepared by dissolving 1 g of N-β-(aminoethyl)-γ-aminopropyltrimethoxysilane in 9 g of N-methyl-2-pyrrolidone, and 1.5 g of this solution was added to 100 g of the solution of poly(amic acid) containing siloxane linkages used in Example 2 to obtain a resin composition. This composition was tested and evaluated in the same way as in Example 1, the results being shown in Table 1 and FIGS. 7 and 8.

COMPARATIVE EXAMPLE 1

6.385 g of 4,4'-diaminodiphenylether, 3.478 g of pyromellitic acid dianhydride and 5.137 g of 3,3',4,4'-benzophenonetetracarboxylic acid dianhydride were reacted in 85 g of N-methyl-2-pyrrolidone to obtain a poly(amic acid) solution, and to this solution was added 3.0 g of the aminosilane solution prepared in Example 1 to produce a resin composition. This resin composition was subjected to the same test and evaluation as in Example 1. Exfolation of the film took place after the passage of 5 hours in the pressure cook test. It was also found that the composition is greatly increased in viscosity when kept at 5° C. The results are shown in Table 1 and FIGS. 7 and 8.

COMPARATIVE EXAMPLE 2

5.695 g of 4,4'-diaminodiphenylether, 0.767 g of 4,4'-diaminodiphenylether-3-carbonamide, 3.447 g of pyromellitic acid dianhydride and 5.091 g of 3,3',4,4'-benzophenonetetracarboxylic acid dianhydride were reacted in 85 g of N-methyl-2-pyrrolidone to obtain a poly(amic acid), and its viscosity was adjusted.

A solution was prepared separately by dissolving 1 g of γ-aminopropyltriethoxysilane in 4 g of N-methyl-2-pyrrolidone, and 3 g of this solution was added to 100 g of said viscosity-adjusted poly(amic acid) to prepare a resin composition. This resin composition, when subjected to the same test and evaluation as in Example 1, not only showed a reduction of adhesiveness but was also greatly increased in viscosity when left at 5° C., indicating that this composition cannot stand long-time practical use. The results are shown in Table 1 and FIGS. 7 and 8.

COMPARATIVE EXAMPLE 3

The solution of poly(amic acid) containing siloxane linkages prepared and used in Example 1 was used singly, and the evaluation was made by the method of Example 1. As a result, film exfoliation occurred in 5 hours in the pressure cook test (PCT). The results are shown in Table 1 and FIGS. 7 and 8.

COMPARATIVE EXAMPLE 4

6.0 g of the same aminosilane solution as used in Example 1 was added to 100 g of the solution of poly(amic acid) containing siloxane linkages used in Example 1, and the resulting resin composition was tested and evaluated as in Example 1. The compsoition elevated greatly in viscosity when left at 5° C. The results are shown in Table 1 and FIGS. 7 and 8.

TABLE 1

| | Content of siloxane linkages (mol %) | Type of aminosilane | Amount of aminosilane (wt %) | Properties of cured product 350° C./1 h | | Viscosity stability*3 |
|---|---|---|---|---|---|---|
| | | | | Heat resistance*1 | Adhesiveness*2 | |
| Example 1 | 5.0 | γ-Aminopropyltriethoxysilane | 0.5 | 440 | o | o |
| Example 2 | 2.0 | γ-Aminopropyltriethoxysilane | 1.0 | 450 | o | o |
| Example 3 | 5.0 | N—phenyl-γ-aminopropyltriethoxysilane | 0.5 | 440 | o | o |
| Example 4 | 2.0 | N-β(aminoethyl)-γ-aminopropyltrimethoxysilane | 1.0 | 450 | o | o |
| Comparative Example 1 | 0 | γ-Aminopropyltriethoxysilane | 2.0 | 450 | x | o |
| Comparative Example 2 | 0 | γ-Aminopropyltriethoxysilane | 4.0 | 460 | x | x |
| Comparative Example 3 | 5.0 | None | 0 | 440 | x | o |
| Comparative Example | 5.0 | γ-Aminopropylethoxysilane | 4.0 | 440 | o | x |

TABLE 1-continued

| Content of siloxane linkages (mol %) | Type of aminosilane | Amount of aminosilane (wt %) | Properties of cured product 350° C./1 h | | Viscosity stability*[3] |
| --- | --- | --- | --- | --- | --- |
| | | | Heat resistance*[1] | Adhesiveness*[2] | |
| 4 | | | | | |

*[1] Thermal decomposition starting temperature (measured by differential heat balance).
*[2] Cross-cut test after 121° C./2.2 atm. PCT
o . . . No exfoliation
x . . . Exfoliated
*[3] Viscosity stability of the composition when kept at 5° C.
o . . . Good viscosity stability
x . . . Bad viscosity stability As apparent from the foregoing Examples and Comparative Examples, the resin compositions of this invention have high viscosity stability and can form a polyimide film very excellent in heat resistance and adhesiveness.

COMPARATIVE EXAMPLE 5

6.035 g of 4,4'-diaminodiphenylether, 0.394 g of 1,3-bis(aminopropyl)tetramethyldisiloxane, 3.460 g of pyromellitic acid dianhydride and 5.110 g of 3,3',4,4'-benzophenonetetracarboxylic acid dianhydride were reacted in 85.0 g of N-methyl-2-pyrrolidone at room temperature to obtain 100 g of a solution of poly(amic acid) containing siloxane linkages. This solution had a viscosity of 200 ps, so its viscosity was reduced and adjusted to 10 ps by stirring the solution at 80° C.

This solution was spinner coated at 3,000 r.p.m. for 30 seconds on a semiconductor substrate having formed thereon a silicon oxide ($SiO_2$) and Al wiring layers and then heat cured in an $N_2$ gas atmosphere at 200° C. for 30 minutes and then at 350° C. for 60 minutes to form a 2 μm thick polyimide resin surface protective film. Then the bonding pad portions were opened out and the product was packaged with an epoxy sealant to make a semiconductor device.

EXAMPLE 5

A solution prepared by dissolving 1 g of γ-aminopropyltriethoxysilane in 9 g of N-methyl-2-pyrrolidone was added to the poly(amic acid) solution obtained in Comparative Example 5, and both solutions were mixed up by stirring at room temperature for one hour to obtain a polyimide precursor resin composition having a nonvolatile concentration of 14.3% by weight after 2-hour heat treatment at 200° C. and a viscosity of 10.5 ps at 25° C. By using this resin composition, a polyimide resin film was formed under the same conditions as in Comparative Example 5.

Figure 4:
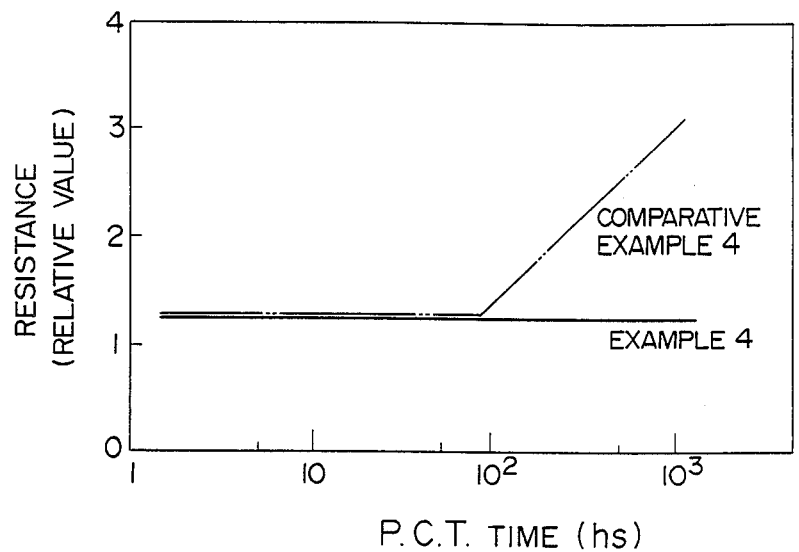
FIG. 4 is a graph showing the change of resistance in a pressure cook test conducted in an Example of this invention and in a Comparative Example.

The samples of seiconductor devices made in Comparative Example 5 and Example 5 were subjected to a moisture resistance reliability test. In this test, pressure cook test was conducted on each sample of semiconductor device under the conditions of 121° C. and 2.1 atm. vapor pressure, and the change of resistance of Al wiring layer was examined. The determined values are shown comparatively in FIG. 4.

It is seen that the semiconductor device of Example 5 using a polyimide precursor resin composition according to this invention is superior to the semiconductor device of Comparative Example 5 in moisture resistance reliability.

EXAMPLE 6

Figure 5:
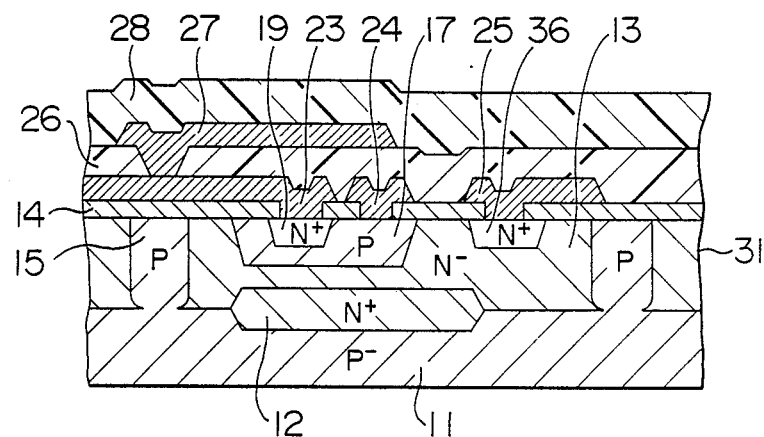
FIG. 5 is a partial sectional view of a semiconductor chip in a semiconductor device according to an embodiment of this invention.
Figure 6:
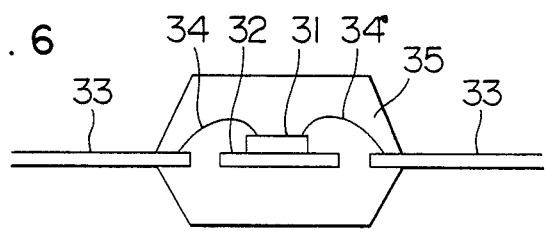
FIG. 6 is a schematic sectional view of a semiconductor device obtained by sealing said semiconductor chip with resin.

FIG. 5 illustrates a sectional view of a semiconductor chip, and FIG. 6 shows a schematic sectional view of a semiconductor device completed by resin sealing said semiconductor chip. The embodiment of FIG. 5 is shown as applied to a bipolar type IC of a double-layer wiring structure. In the drawing, in order to simplify the explanation, there is shown only the structure of a bipolar transistor formed in one element forming island.

Semiconductor chip 31 illustrated in FIG. 5 comprises a P$^-$ type single-crystal silicon (Si) semiconductor substrate 11, an N$^+$ type semiconductor imbedded layer 12, an N$^-$ type silicon semiconductor layer 13 formed on substrate 1 by epitaxial growth, a 4,000–8,000 Å thick si dioxide ($SiO_2$) or phosphorous glass film 14 covering the main surface of semiconductor layer 13, said film 14 being partly opened by photoetching, P type isolation regions 15 formed by diffusion techniques for electrically separating semiconductor layer 13 into plural element forming islands, said isolation regions 15 being positioned encompassing the element forming islands to be separated from each other, a P type base region 17 formed by diffusion techniques, an N$^+$ type emitter region 19, an N$^+$ type collector pick-up region (contact region) 36, and a first conductor layer (sublayer) forming an Al wiring layer having the portions 23, 24 and 25 which are in resistance contact with the emitter, base and collector regions, respectively, and overlie silicon oxide film 14. Said Al wiring layer is formed by vacuum evaporation or sputtering and the unnecessary portions are removed by photoetching to form a pattern. This wiring layer is, for instance, 1.5 μm thick and 7 μm wide.

The semiconductor chip also includes a polyimide resin film 26 which was made from a polyimide precursor resin composition according to this invention. The thickness of said polyimide resin film 26 is, for instance, 2.5 μm. This resin film was formed in the following way.

6.035 g (95 mol %) of 4,4'-diaminodiphenylether, 0.394 g (5 mol %) of 1,3-bis(aminopropyl)tetramethyldisiloxane, 3.460 g (50 mol %) of pyromellitic acid dianhydride and 5.110 g (50 mol %) of 3,3',4,4'-benzophenonetetracarboxylic acid dianhydride were reacted in 75.0 g of N-methyl-2-pyrrolidone at room temperature to obtain 90 g of a solution of poly(amic acid) containing siloxane linkages. As this solution had a viscosity of 200 ps, its viscosity was lowered by stirring at 80° C. and adjusted to 10 ps.

Then a solution was prepared by dissolving 1 g of γ-aminopropyltriethoxysilane in 9 g of N-methyl-2-pyrrolidone, and 0.75 g of this solution was added to 90 g of said poly(amic acid) solution which had been cooled to room temperature, and the mixed solution was stirred at room temperature for one hour. The thus obtained resin composition had a nonvolatile concentration of 16.3% by weight as measured at 200° C./2 hours and viscosity of 10.5 ps at 25° C.

This resin composition was spin coated on the Al wiring layer at 3,500 r.p.m. for 30 seconds and then heat treated in an $N_2$ gas atmosphere at 100° C. for 30 minutes, then at 200° C. for 30 minutes and further at 350° C. for 60 minutes to form a polyimide resin film. Then, a photoresist film was selectively formed on said resin film as a mask and said polyimide resin film 26 was etched through said mask to form contact holes for the Al wiring layer. Thereafter, the photoresist mask was removed and an Al wiring layer 27 (second conductor layer) was formed by vacuum evaporation.

Al wiring layer 27 is, for instance, 1.5 μm in thickness and 7 μm in width. An additional polyimide resin film 28 is formed covering said second Al wiring layer as a final protective film. This protective film is made of the same material and by the same treatment as the second insulating layer. The thickness of this final protective film is, for instance, 2.5 μm. Although not shown, this final protective resin film has its bonding pad areas photoetched to form through-holes to expose the plural bonding pad portions connected to Al wiring layer 27. The exposed bonding pad portions have an area of, for instance, 130 μm×130 μm.

This semiconductor chip is sealed with a resin as shown in FIG. 6. In FIG. 6, said semiconductor chip is designated by numeral 31, and relevant circuits are integrated therein. Semiconductor chip 31 is secured to a fixed electrode (tab electrode) 32 by a gold-silicon eutectic alloy or the like and also electrically connected to external lead-out wires 33 through connector wires 34. Securing of said semiconductor chip 31 to fixed electrode 32 and connection of connector wire (which may, for instance, be made of gold) between semiconductor chip 31 and external lead-out wire can be accomplished by known techniques. As is well known, connection of semiconductor chip and connector wire is made in the form of a lead frame. In FIG. 6, numeral 35 designates an epoxy resin sealant which can be formed by transfer molding techniques well-known in the art. This sealant 35 is applied so as to encompass semiconductor chip 31 and connector wires 34.

In the thus produced semoconductor device of this invention, the underside of Al wiring layer 27, which is the second conductor layer, is covered with polyimide resin film 26 which forms the second insulating layer, and the upperside of said Al wiring layer 27 is covered with polyimide resin film 28 which forms the third insulating layer. Of course, the upper wiring layer is exposed from the third insulating layer or polyimide resin film 28 at the joints to connector wires 34 shown in FIG. 6, that is, at the bonding pad portions (not shown). (In FIG. 6, numeral 31 designates semiconductor chip, 32 fixed electrode, 33 external lead-out wires, 34 connector wires, and 35 sealant). Resin sealant 35 encompasses the third insulating layer (polyimide resin film 28) in contact therewith.

Al wiring layer 27 is so positioned that it is surrounded by polyimide resin film 26 forming the second insulating layer and polyimide resin film 28 forming the third insulating layer. Said polyimide resin film 28 is improved over the conventional polyimide resin films in adhesiveness to the Al wiring layer (second conductor layer) and in adhesive force of the interface between the resin films, so that Al wiring layer 27 is more strongly protected by both polyimide resin films 26, 28 against moisture penetration from the outside through resin sealant 35. In fact, Al wiring layer 27 is more positively prevented from corrosion due to moisture which penetrated from the outside by using the polyimide resin film of this invention than when using the conventional polyimide resin films.

It is to be noted in this connection that the bonding pads exposed from polyimide resin film 28 have a large area such as, for example, 130 μm×130 μm, and the joints of connector wires stay thereover in such a manner as to cover said pad portions, so that the corrosion, if any, of Al wiring layer 27 at its portions exposed from said polyimide resin film 28 is substantially neglible.

Further, owing to the excellent adhesiveness of polyimide resin of this invention to silicon dioxide film 4 which is the first insulating layer, there is unnecessitated the step of forming a layer of coupling agent which has been necessary for securing adhesion to the inorganic films in case of using conventional polyimide resins.

In order to confirm the effect of the invention, the present inventors have made semiconductor devices by using the polyimide resin of this invention and the conventional polyimide resins for the layer insulating film forming the second insulating layer and the final protective film forming the third insulating layer in said structure, and these semiconductor devices were subjected to a moisture resistance test to obtain the following results.

For the test, the bipolar type IC obtained in the Example shown above was used. Aluminum was used for the first and second conductor layers, both layers being 1.5 μm in thickness. In the semiconductor devices used in the test, the second conductor layer was not exposed because of omission of etching of bonding pad portions which is usually conducted after formation of the final protective film (third insulating film). Also, no resin seal was applied.

TEST EXAMPLE 1

A semiconductor device was made by using the resin composition of this invention for both of the interlaminar insulating film and the final protective film. The forming and treating methods were the same as described in the above Examples.

TEST EXAMPLE 2

A semiconductor device was made by using a polyimide resin containing siloxane linkages for both the interlaminar insulating film and the final protective film. This siloxane linkage-containing polyimide resin film was formed by first preparing a solution of poly(amic acid) containing siloxane linkages (resin concentration: 15% by weight; viscosity: 1,200 cps) by mixing 35% by mole of 4,4'-diaminodiphenylmethane, 10% by mole of 4,4'-diaminodiphenylether-3-carbonamide, 5% by mole of 1,3-bis(aminopropyl)-tetramethyldisiloxane and 50% by mole of pyromellitic acid dianhydride in N-methyl-2-pyrrolidone and reacting them at room temperature for 5 hours, then spin coating said poly(amic acid) solution at 3,000 r.p.m. for 30 seconds and subjecting the same to a 30-minute heat treatment at 200° C. in an $N_2$ atmosphere and then to an additional 60-minute heat treatment at 350° C.

TEST EXAMPLE 3

A semiconductor device was made by using a polyimide resin film for both of the interlaminar insulating film and the final protective film. This polyimide resin film was formed by using PI-2545 (mfd. by E. I. du Pont de Nemours & Co.) which is a poly(amic acid) solution obtained by reacting diaminodiphenylether and pyromellitic acid dianhydride with a substantially equimolar quantity of N-methylpyrrolidone and by treating said poly(amic acid) solution under the same condutions as in Test Example 2.

TEST EXAMPLE 4

A semiconductor device was made by using a polyimide resin film for both of the interlaminar insulating film and the final protective coating film. This polyimide resin film was formed by using Pyre-ML (mfd. by E. I. du Pont de Nemours & Co.) and treating it by the same process as in Test Example 2.

A moisture resistance test was conducted on the samples of semiconductor devices made in Test Examples 1-4. In this test, each sample was left under the condition of 121° C. and 2.1 atm. vapor pressure and the state of corrosion of the Al wiring layer forming the second conductor layer was observed with a microscope at regular time intervals. The results are shown in Table 2 below, in which A indicates that the Al wiring layer in the chip was free of corrosion, B indicates that about 5-10% of the Al wiring layer was corroded, C indicates that 30-50% of the Al wiring layer was corroded, D indicates that corrosion was seen throughout the chip, and E indicates that the wiring layer partly melted away.

It is seen from these results that the sample of Test Example 1 using the polyimide resin of this invention has 3-5 times as high moisture resistance as the samples using the conventional polyimide resins.

TABLE 2

| Evaluation results (time passed) | Results of moisture resistance test (121° C., 2.1 atm.) Insulating film | | | |
|---|---|---|---|---|
| | Test Example 1 | Test Example 2 | Test Example 3 | Test Example 4 |
| 5 | A | A | A | A |
| 10 | A | A | A | B |
| 15 | A | A | B | C |
| 20 | A | A | C | C |
| 25 | A | B | C | D |
| 30 | A | B | D | E |
| 35 | A | B | D | — |
| 40 | A | B | E | — |
| 45 | A | C | — | — |
| 50 | A | C | — | — |
| 60 | A | C | — | — |
| 70 | B | D | — | — |
| 80 | B | — | — | — |
| 90 | C | — | — | — |
| 100 | C | — | — | — |

The semiconductor device having formed on its conductor layers a polyimide resin film made from the dehydrated and ring-closed polyimide precursor resin composition of this invention is very excellent in moisture resistance reliability and especially useful for electronic parts which are required to have high reliability.

What is claimed is:

1. A semiconductor device having formed on conductor layers a polyimide resin film made by dehydrating and ring-closing a polyimide precursor resin composition comprising (a) a poly(amic acid) containing siloxane linkages obtained by reacting an aromatic diamine, a diaminosiloxane and an aromatic tetracarboxylic acid dianhydride, and (b) an aminosilane represented by the formula:

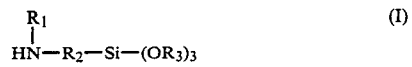

wherein $R_1$ is a hydrogen atom or a monovalent hydrocarbon residue; $R_2$ is a divalent hydrocarbon residue; and $R_3$ is a monovalent hydrocarbon residue, the proportion of said diaminosiloxane for reaction being 0.1-10% by mole based on the total molar quantity of said aromatic diamine and diaminosiloxane, and the proportion of said aminosilane in the composition being 0.1-2.0% by weight based on said poly(amic acid).

2. A semiconductor device according to claim 1, wherein the aromatic diamine is at least one member selected from the group consisting of 4,4'-diaminodiphenylether, 4,4'-diaminodiphenylmethane, 4,4'-diaminodiphenylsulfone, 4,4'-diaminodiphenyl sulfide, benzidine, metaphenylenediamine, paraphenylenediamine, 1,5-naphthalenediamine, 2,6-naphthalenediamine and a compound of the formula:

wherein Ar is an aromatic group; and Y is $SO_2$ or CO, and one amino group and the Y—$NH_2$ are at the ortho positions relative to each other, the diaminosiloxane is at least one compound of the formula:

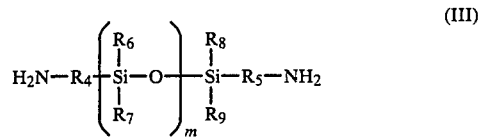

wherein $R_4$ and $R_5$ are independently a divalent hydrocarbon residue; $R_6$, $R_7$, $R_8$ and $R_9$ are independently a monovalent hydrocarbon residue; and m is an integer of 1 or greater, and the aromatic tetracarboxylic acid dianhydride is at least one member selected from the group consisting of pyromellitic acid dianhydride, 3,3',4,4'-diphenyltetracarboxylic acid dianhydride, 3,3',4,4'-benzophenonetetracarboxylic acid dianhydride, cyclopentanetetracarboxylic acid dianhydride, 1,2,5,6-naphthalenetetracarboxylic acid dianhydride, 2,3,6,7-naphthalenetetracarboxylic acid dianhydride, 2,3,5,6-pyridinetetracarboxylic acid dianhydride, 1,4,5,8-naphthalenetetracarboxylic acid dianhydride, 3,4,9,10-perilenetetracarboxylic acid dianhydride, and 4,4'-sulfonyldiphthalic acid dianhydride.

3. A semiconductor device according to claim 1, wherein the aminosilane is at least one member selected from the group consisting of γ-aminopropyltrimethoxysilane, γ-aminopropyltriethoxysilane, γ-aminobutyltriethoxysilane, N-phenyl-γ-aminopropyltriethoxysilane, N-β-(aminoethyl)-γ-aminopropyltrimethoxysilane, and γ-ureidopropyltriethoxysilane.

4. A semiconductor device according to claim 1, wherein the aminosilane is γ-aminopropyltriethoxysilane and the diaminosiloxane is 1,3-bis(3-aminopropyl)-1,1,3,3-tetramethyldisiloxane.

5. A polyimide precursor resin composition comprising (a) a poly(amic acid) containing siloxane linkages obtained by reacting an aromatic diamine, a diaminosiloxane and an aromatic tetracarboxylic acid dianhydride, (b) an aminosilane represented by the formula:

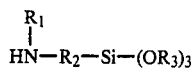 (I)

$$HN-R_2-Si-(OR_3)_3$$

wherein $R_1$ is a hydrogen atom or a monovalent hydrocarbon residue; $R_2$ is a divalent hydrocarbon residue; and $R_3$ is a monovalent hydrocarbon residue, and (c) a solvent capable of dissolving said both compounds (a) and (b), the proportion of said diaminosiloxane for reaction being 0.1–10% by mole based on the total molar quantity of said aromatic diamine and diaminosiloxane, and the proportion of said aminosilane in the composition being 0.1–2.0% by weight based on said poly(amic acid).

6. A composition according to claim 5, wherein the aromatic diamine is at least one member selected from the group consisting of 4,4′-diaminodiphenylether, 4,4′-diaminodiphenylmethane, 4,4′-diaminodiphenylsulfone, 4,4′-diaminodiphenyl sulfide, benzidine, metaphenylenediamine, paraphenylenediamine, 1,5-naphthalenediamine, 2,6-naphthalenediamine and a compound of the formula:

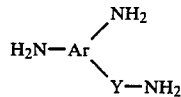 (II)

wherein Ar is an aromatic group, and Y is $SO_2$ or CO, and one amino group and the Y—$NH_2$ group are at the ortho positions relative to each other, the diaminosiloxane is at least one compound of the formula:

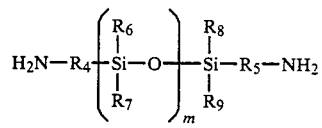 (III)

wherein $R_4$ and $R_5$ are independently a divalent hydrocarbon residue; $R_6$, $R_7$, $R_8$ and $R_9$ are independently a monovalent hydrocarbon residue; and m is an integer of 1 or greater, and the aromatic tetracarboxylic acid dianhydride is at least one member selected from the group consisting of pyromellitic acid dianhydride, 3,3′,4,4′-diphenyltetracarboxylic acid dianhydride, 3,3′,4,4′-benzophenonetetracarboxylic acid dianhydride, cyclopentanetetracarboxylic acid dianhydride, 1,2,5,6-naphthalenetetracarboxylic acid dianhydride, 2,3,6,7-naphthalenetetracarboxylic acid dianhydride, 2,3,5,6-pyridinetetracarboxylic acid dianhydride, 1,4,5,8-naphthalenetetracarboxylic acid dianhydride, 3,4,9,10-perilenetetracarboxylic acid dianhydride, and 4,4′-sulfonyldiphthalic acid dianhydride.

7. A composition according to claim 5, wherein the aminosilane is at least one member selected from the group consisting of γ-aminopropyltrimethoxysilane, γ-aminopropyltriethoxysilane, γ-aminobutyltriethoxysilane, N-phenyl-γ-aminopropyltriethoxysilane, N-β-(aminoethyl)-γ-aminopropyltrimethoxysilane, and γ-ureidopropyltriethoxysilane.

8. A composition according to claim 5, wherein the solvent is at least one member selected from the group consisting of N-methyl-2-pyrrolidone, N,N-dimethylacetamide, N,N-dimethylformamide, N,N-diethylformamide, dimethyl sulfoxide, hexamethylphosphoramide, and tetramethylenesulfone.

9. A composition according to claim 5, wherein the aminosilane is γ-aminopropyltriethoxysilane.

10. A composition according to claim 5, wherein the diaminosiloxane is 1,3-bis(3-aminopropyl)-1,1,3,3-tetramethyldisiloxane.

* * * * *